United States Patent
Chu

(10) Patent No.: US 11,329,763 B2
(45) Date of Patent: May 10, 2022

(54) DECODING METHOD AND ASSOCIATED CIRCUIT

(71) Applicant: Realtek Semiconductor Corp., HsinChu (TW)

(72) Inventor: Tang-Ting Chu, Taoyuan (TW)

(73) Assignee: Realtek Semiconductor Corp., HsinChu (TW)

( * ) Notice: Subject to any disclaimer, the term of this patent is extended or adjusted under 35 U.S.C. 154(b) by 151 days.

(21) Appl. No.: 16/792,276

(22) Filed: Feb. 16, 2020

(65) Prior Publication Data

US 2020/0287656 A1  Sep. 10, 2020

(30) Foreign Application Priority Data

Mar. 6, 2019 (TW) ................................ 108107420

(51) Int. Cl.
    *H04L 1/00* (2006.01)
(52) U.S. Cl.
    CPC ............ *H04L 1/005* (2013.01); *H04L 1/0057* (2013.01)
(58) Field of Classification Search
    CPC ..... H04L 1/005; H04L 1/0057; H04L 1/0051; H03M 13/3715; H03M 13/1128; H03M 13/1105
    See application file for complete search history.

(56) References Cited

U.S. PATENT DOCUMENTS

| | | | |
|---|---|---|---|
| 8,351,509 B1* | 1/2013 | Hurd ............... | H04N 19/00684 375/240.16 |
| 10,372,539 B2* | 8/2019 | Avraham ............ | H03M 13/356 |
| 10,389,383 B2* | 8/2019 | Xiong .................. | H03M 13/118 |
| 10,389,389 B2* | 8/2019 | Goldenberg ...... | H03M 13/3723 |
| 10,484,012 B1* | 11/2019 | Tunali ................ | H03M 13/1125 |
| 10,613,927 B1* | 4/2020 | Symons ................ | H03M 13/45 |
| 10,797,728 B1* | 10/2020 | Varnica ............. | H03M 13/3707 |
| 11,115,051 B2* | 9/2021 | Chang ................ | H03M 13/3715 |
| 2003/0110437 A1* | 6/2003 | Kim .................... | H03M 13/4138 714/752 |
| 2015/0220389 A1* | 8/2015 | Kim .................. | H03M 13/3715 714/764 |
| 2015/0242143 A1* | 8/2015 | Kim ..................... | G11C 16/349 714/704 |
| 2015/0263763 A1* | 9/2015 | Kim .................. | H03M 13/3707 714/752 |

(Continued)

FOREIGN PATENT DOCUMENTS

| | | | | |
|---|---|---|---|---|
| CN | 102176690 A | * | 9/2011 | ............... H04L 1/00 |
| WO | WO-2011048100 A1 | * | 4/2011 | ......... G10L 19/0208 |

(Continued)

*Primary Examiner* — Jay P Patel
(74) *Attorney, Agent, or Firm* — Winston Hsu

(57) ABSTRACT

A decoding method and associated circuit are provided. The circuit includes a first memory, a decoder and a control circuit. In operations of the circuit, the first memory is configured to receive a data stream; the decoder is configured to receive the data stream to sequentially generate a plurality of frames, and sequentially decode the plurality of frames to respectively generate a plurality of codewords; and the control circuit is configured to determine an allowed maximum iteration count for decoding a current frame according to an iteration count for successfully decoding at least one previous frame of the current frame.

12 Claims, 4 Drawing Sheets

(56) References Cited

U.S. PATENT DOCUMENTS

| | | | | |
|---|---|---|---|---|
| 2016/0013810 | A1* | 1/2016 | Gross | H03M 13/13 |
| | | | | 714/776 |
| 2017/0187491 | A1* | 6/2017 | Jang | H03M 13/1117 |
| 2018/0076831 | A1* | 3/2018 | Hamelin | H03M 13/617 |
| 2018/0219561 | A1* | 8/2018 | Litsyn | H03M 13/2948 |
| 2018/0343082 | A1* | 11/2018 | Xiong | H03M 13/1108 |
| 2019/0149168 | A1* | 5/2019 | Chang | H03M 13/1108 |
| | | | | 714/752 |
| 2019/0312593 | A1* | 10/2019 | Hsiao | G06F 11/1068 |
| 2019/0379405 | A1* | 12/2019 | Cho | G06F 3/0679 |
| 2020/0036393 | A1* | 1/2020 | Ha | H03M 13/1125 |
| 2020/0036651 | A1* | 1/2020 | Chautru | H04L 47/805 |
| 2020/0373943 | A1* | 11/2020 | Cho | G06F 11/1048 |
| 2020/0373944 | A1* | 11/2020 | Cho | H03M 13/3707 |

FOREIGN PATENT DOCUMENTS

| | | | | |
|---|---|---|---|---|
| WO | WO-2011080020 A1 | * | 7/2011 | H03M 13/6393 |
| WO | WO-2015168862 A1 | * | 11/2015 | H04L 29/08 |
| WO | WO-2016159464 A1 | * | 10/2016 | H04L 27/0006 |

* cited by examiner

DECODING METHOD AND ASSOCIATED CIRCUIT

BACKGROUND OF THE INVENTION

1. Field of the Invention

The present invention is related to decoders, and more particularly, to a circuit comprising a low-density parity-check (LDPC) decoder.

2. Description of the Prior Art

An error correction decoder is installed in a data transmission system to eliminate errors due to channel noise/interference during the transmission process. A low-density parity-check (LDPC) decoder has the features of iteration and belief propagation, wherein probability information (also referred to as an extrinsic message) of a new node is estimated after exchanging an intrinsic message comprising probability information with probability information of adjacent nodes by a specific interconnection rule. The LDPC decoder combines the intrinsic message and the extrinsic message to determine whether a decoding operation is correct, where if the decoding operation is correct, the LDPC decoder will terminate the decoding operation and generate a correct codeword, and if the decoding operation is incorrect, the LDPC decoder will continue iterative operations until there is no error (i.e. the codeword is error free).

In theory, regarding an intrinsic message which does not fall into a trapping set and a frame that has more errors due to transmission interference, the LDPC decoder merely needs to perform more iterations in order to completely eliminate errors. In practice, due to limits of transmission delay in different specifications, an allowed maximum iteration count of the LDPC decoder for each frame in the decoding process is limited to be a maximum decoding time of each frame (e.g. 7 to 8 iterations). However, according to statistical experimental results, most frames which do not have severe interference merely need 2 to 3 iterations to be successfully decoded (i.e. error free), whereas frames with severe interference may require iterations greater than the allowed maximum iteration count. Utilizing a fixed iteration count for decoding may make frames with severe interference unable to be successfully decoded, thereby increasing bit errors within the decoded codeword and reducing decoding efficiency.

SUMMARY OF THE INVENTION

It is therefore an objective of the present invention to provide a decoding method and an associated circuit, which can dynamically modify an allowed maximum iteration count of the LDPC decoder when decoding each frame, in order to increase a probability of successfully decoding a frame that has severe interference to enhance capability of the LDPC decoder, and thereby solve the problem of the related art.

In one embodiment of the present invention, a circuit is disclosed. The circuit comprises a first memory, a decoder and a control circuit. In operations of the circuit, the first memory is configured to receive a data stream; the decoder is coupled to the first memory, and is configured to receive the data stream to sequentially generate a plurality of frames and sequentially decode the plurality of frames to respectively generate a plurality of codewords; and the control circuit is coupled to the decoder, and is configured to determine an allowed maximum iteration count for decoding a current frame according to an iteration count for successfully decoding at least one previous frame of the current frame.

In another embodiment of the present invention, a decoding method is disclosed. The decoding method comprises the following steps: utilizing a first memory to receive a data stream; receiving the data stream from the first memory to sequentially generate a plurality of frames, and sequentially decoding the plurality of frames to respectively generate a plurality of codewords; and determining an allowed maximum iteration count for decoding a current frame according to an iteration count for successfully decoding at least one previous frame of the current frame.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
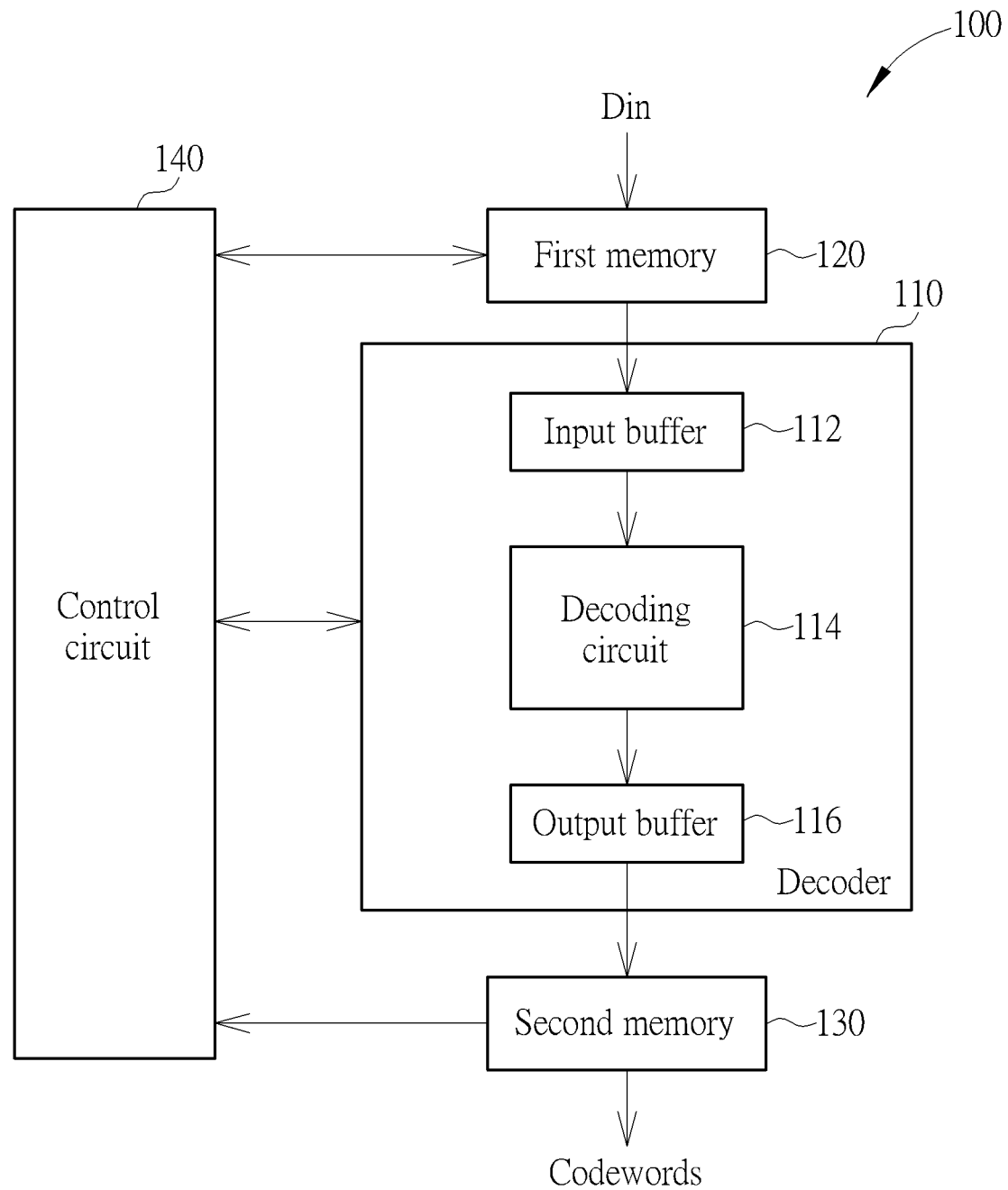
FIG. 1 is a diagram illustrating a circuit according to an embodiment of the present invention.

FIG. 1 is a diagram illustrating a circuit 100 according to an embodiment of the present invention. As shown in FIG. 1, the circuit 100 comprises a decoder 110, a first memory 120, a second memory 130 and a control circuit 140, where the decoder 110 comprises an input buffer 112, a decoding circuit 114 and an output buffer 116. In this embodiment, the decoder 110 is a low-density parity-check (LDPC) decoder, the decoding circuit 114 is an LDPC decoding circuit, and the circuit 100 is applicable to any electronic device that has a need for receiving data streams and decoding; for example, the circuit 100 is applicable to a network interface card.

Figure 2:
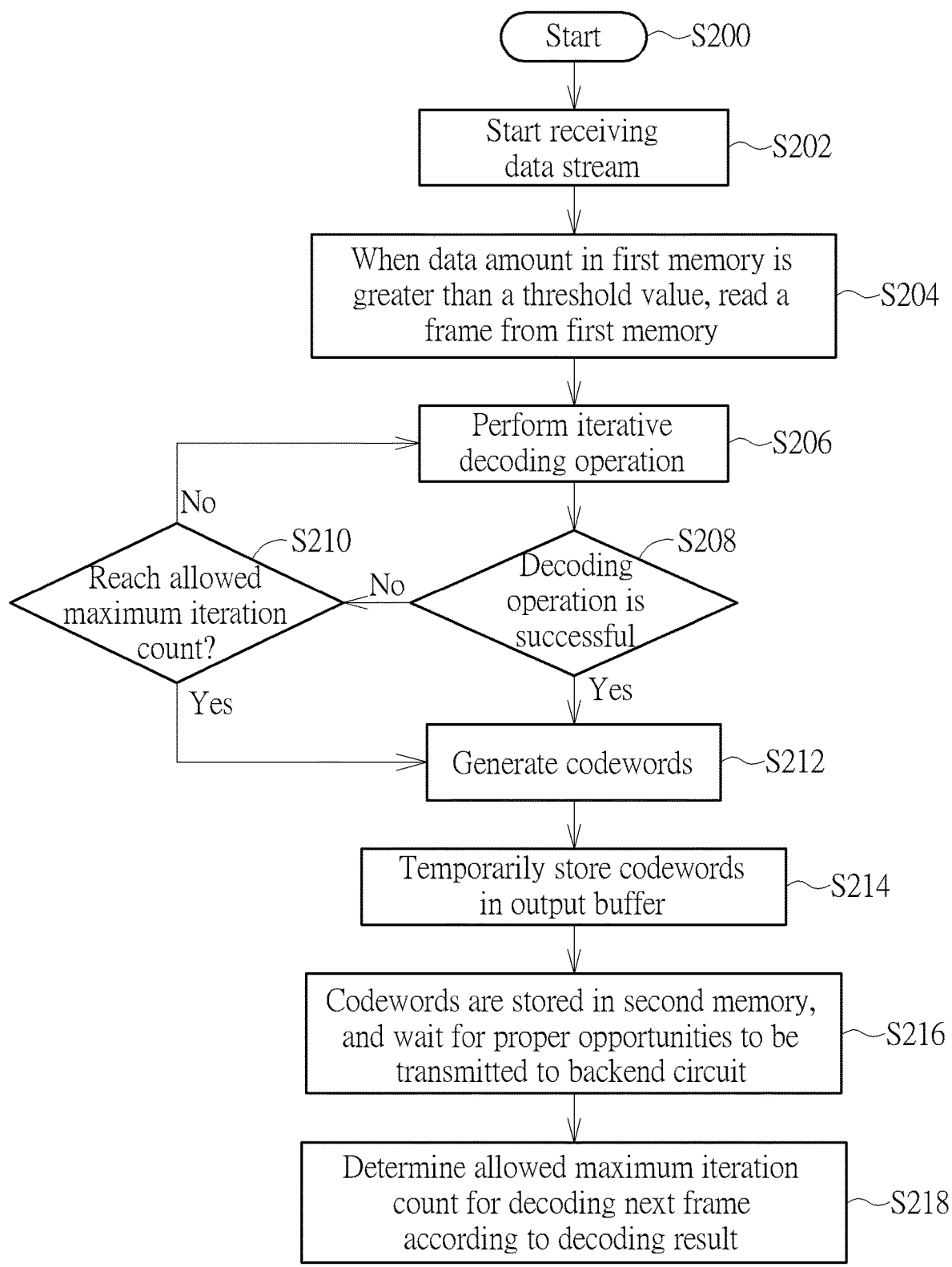
FIG. 2 is a flowchart illustrating a decoding method according to an embodiment of the present invention.

In this embodiment, the circuit 100 is configured to receive a data stream Din to sequentially generate a plurality of codewords to a backend circuit, and through a special access method regarding the first memory 120 and the second memory 130, the control circuit 140 can dynamically determine an allowed maximum iteration count of the decoding circuit 114 for decoding each frame in order to enhance decoding capability of the LDPC decoder. Refer to the circuit architecture shown in FIG. 1 in conjunction with a decoding method shown in FIG. 2. In Step S200, the flow starts. In Step S202, the circuit 100 starts receiving the data stream Din and stores the data stream into the first memory 120, and the control circuit 140 continuously monitors a data amount stored in the first memory 120. In Step S204, when the data amount in the first memory 120 is greater than a threshold value, the control circuit 140 transmits a message to the decoder 110 to make the decoder 110 utilize a higher reading rate to read data within the first memory 120 and store the data into the input buffer 112. Taking examples to illustrate Steps S202 and 204, assume that a rate of writing the data stream Din into the first memory 120 is fs, and a size of one decoding unit (one frame) of the decoding circuit 114 is n intrinsic messages (for example, in related arts of 10 G BASE-T Ethernet LDPC decoders, a size of one frame is 2048 Log-likelihood Ratio (LLR) with probability information), and when the data amount stored in the first memory 120 reaches a half of said one frame (i.e. the threshold value is n/2 intrinsic messages), the decoder 110 may utilize a reading rate of 2*fs to read intrinsic messages within the first memory 120, where n is a positive integer. It should be noted that the aforementioned fs, 2*fs and the threshold value being n/2 intrinsic messages are for illustrative purposes only, and are not limitations of the present invention. As long as the decoder 110 may start reading data when the data amount within the first memory 120 is greater than the threshold value, and a rate of the input buffer 112 receiving the data stream Din from the first memory 120 is greater than a rate of the first memory 120 receiving the data stream Din from outside (e.g. outside of the circuit 100), associated rates and threshold values may have different settings according to real conditions.

In Step S206, when the input buffer 112 has already stored one frame (e.g. 2048 intrinsic messages), and there is space within the output buffer 116 for storing codewords generated by decoding the frame, the decoding circuit 114 may perform iterative decoding operations on the frame. In one iterative operation (e.g. one iterative decoding operation), after exchanging intrinsic messages comprising probability information with probability information of adjacent nodes by a specific interconnection rule, the decoding circuit 114 estimates probability information of new nodes to generate a plurality of modified intrinsic messages. In Step S208, the decoding circuit 114 determines whether the iterative operation this time is successful (e.g. a decoding operation is successful, i.e. an error free codeword is generated) according to the plurality of modified intrinsic messages, where if the decoding operation is successful, the flow enters Step S212; and if the decoding operation fails, the flow enters Step S210. In Step S210, the decoding circuit 114 determines whether an iteration count for the frame has already reached the allowed maximum iteration count: if yes, the flow enters Step S212; if no, the flow returns to Step S206 to perform a next iterative operation to decode the frame.

In Step S212, the decoding circuit 114 generates a plurality of codewords corresponding to the frame according to decoding results. In Step S214, the plurality of codewords corresponding to the frame are temporarily stored in the output buffer 116. In Step S216, the decoder 110 transmits the plurality of codewords stored in the output buffer 116 to the second memory 130, and the plurality of codewords stored in the second memory 130 may wait for proper opportunities to be transmitted to a backend circuit. In this embodiment, a rate of the decoder 110 writing the plurality of codewords into the second memory 130 is greater than a rate of the second memory 130 transmitting the plurality of codewords to the backend circuit.

In Step S218, the control circuit 140 determines an allowed maximum iteration count for decoding a next frame according to an iteration count for successfully decoding the frame. In an embodiment, the control circuit 140 may determine an allowed maximum iteration count for decoding a $(N+K+1)^{th}$ frame according to iteration counts for successfully decoding $N^{th}$ to $(N+K)^{th}$ frames, where N represents a positive integer, and K may be any suitable positive integer, e.g. K may be 1, 2 or 3. More specifically, assuming that a sum of the iteration counts for successfully decoding the $N^{th}$ to $(N+K)^{th}$ frames is less than a threshold value, the control circuit 140 may increase allowable maximum iteration counts for decoding the $(N+K+1)^{th}$ frames; for example, the control circuit 140 may set execution time of the allowed maximum iteration count for decoding the $(N+K+1)^{th}$ frame to be greater than time for the first memory 120 receiving one frame of the data stream Din. In addition, assuming that the sum of the iteration counts for successfully decoding the $N^{th}$ to $(N+K)^{th}$ frames is greater than the threshold value, the control circuit 140 may set the execution time of the allowed maximum iteration count for decoding the $(N+K+1)^{th}$ frame to be equal to or less than the time for the first memory 120 receiving one frame of the data stream Din.

Figure 3:
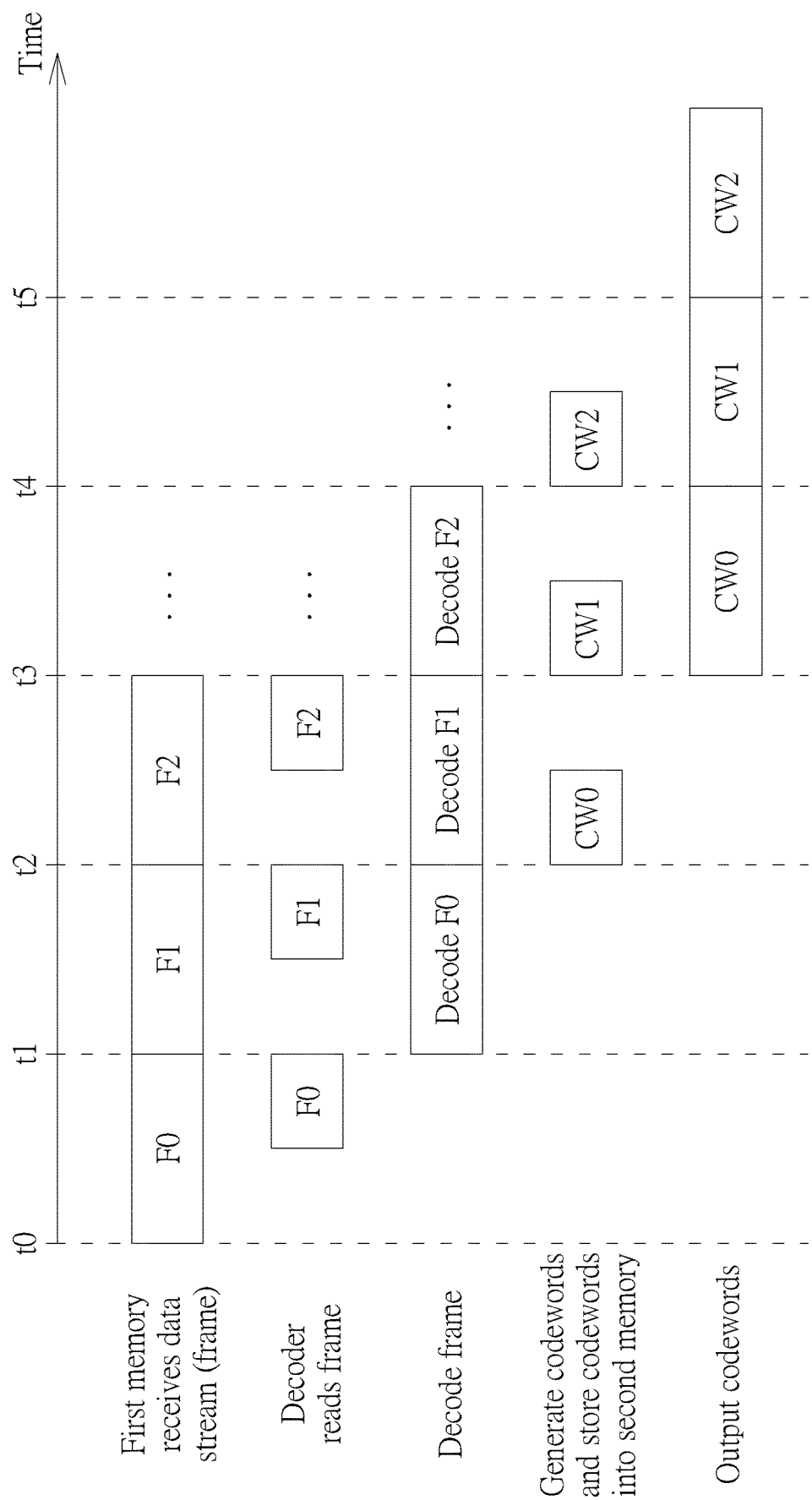
FIG. 3 is a timing diagram illustrating a circuit receiving and processing a plurality of frames of a data stream according to an embodiment of the present invention.

FIG. 3 is a timing diagram illustrating the circuit 100 receiving and processing a plurality of frames of the data stream Din according to an embodiment of the present invention, where this embodiment assumes that time required for successfully decoding each frame is less than time for the first memory 120 receiving one frame, and time for the memory receiving each frame is substantially the same. As shown in FIG. 3, at a time point t0, the first memory 120 receives a first frame F0 at the rate of fs, and the decoder 110 reads the first frame F0 from the first memory 120 at the rate of 2*fs when the data amount stored by the first memory 120 is greater than the threshold value. In this embodiment, the first memory 120 receives the whole first frame F0 at a time point t1, and the input buffer 112 within the decoder 110 receives the whole first frame F0 after the time point t1. At the time point t1, the decoding circuit 114 then decodes the first frame F0 and generates corresponding codewords CW0, and writes the codewords CW0 into the second memory 130 at the rate of 2*fs at a time point t2. During a period between time points t3 and t4, the codewords CW0 within the second memory 130 are transmitted to the backend circuit at the rate of fs.

Similarly, at the time point t1, the first memory 120 receives a second frame F1 at the rate of fs, and the decoder 110 reads the second frame F1 from the first memory 120 at the rate of 2*fs when the data amount stored by the first memory 120 is greater than the threshold value. In this embodiment, the first memory 120 receives the whole second frame F1 at the time point t2, and the input buffer 112 within the decoder 110 receives the whole second frame F1 after the time point t2. At the time point t2, the decoding circuit 114 then decodes the second frame F1 and generates corresponding codewords CW1, and writes the codewords CW1 into the second memory 130 at the rate of 2*fs at the time point t3. During a period between time points t4 and t5, the codewords CW1 within the second memory 130 are transmitted to the backend circuit at the rate of fs.

Operations of a third frame F2 and subsequent frames are similar to the aforementioned first frame F0 and second frame F1, and related details are omitted for brevity.

In the embodiment of FIG. 3, since the time required for successfully decoding each frame is less than the time for the first memory 120 receiving one frame, i.e. the iteration count for the decoding circuit 114 successfully decoding each frame is less than a predetermined value (in this embodiment, the predetermined value is an allowed count for the decoding circuit 114 executing iterative operations during the time for the first memory 120 receiving one frame), the control circuit 140 may increase the allowed maximum iteration counts for decoding subsequent frames. For example, assuming that the predetermined value of the iteration count is "8", the control circuit 140 may control the decoding circuit 114 to make the allowed iteration count for decoding the first frame F3 be "16", i.e. the iteration operations are performed 16 times at most.

Figure 4:
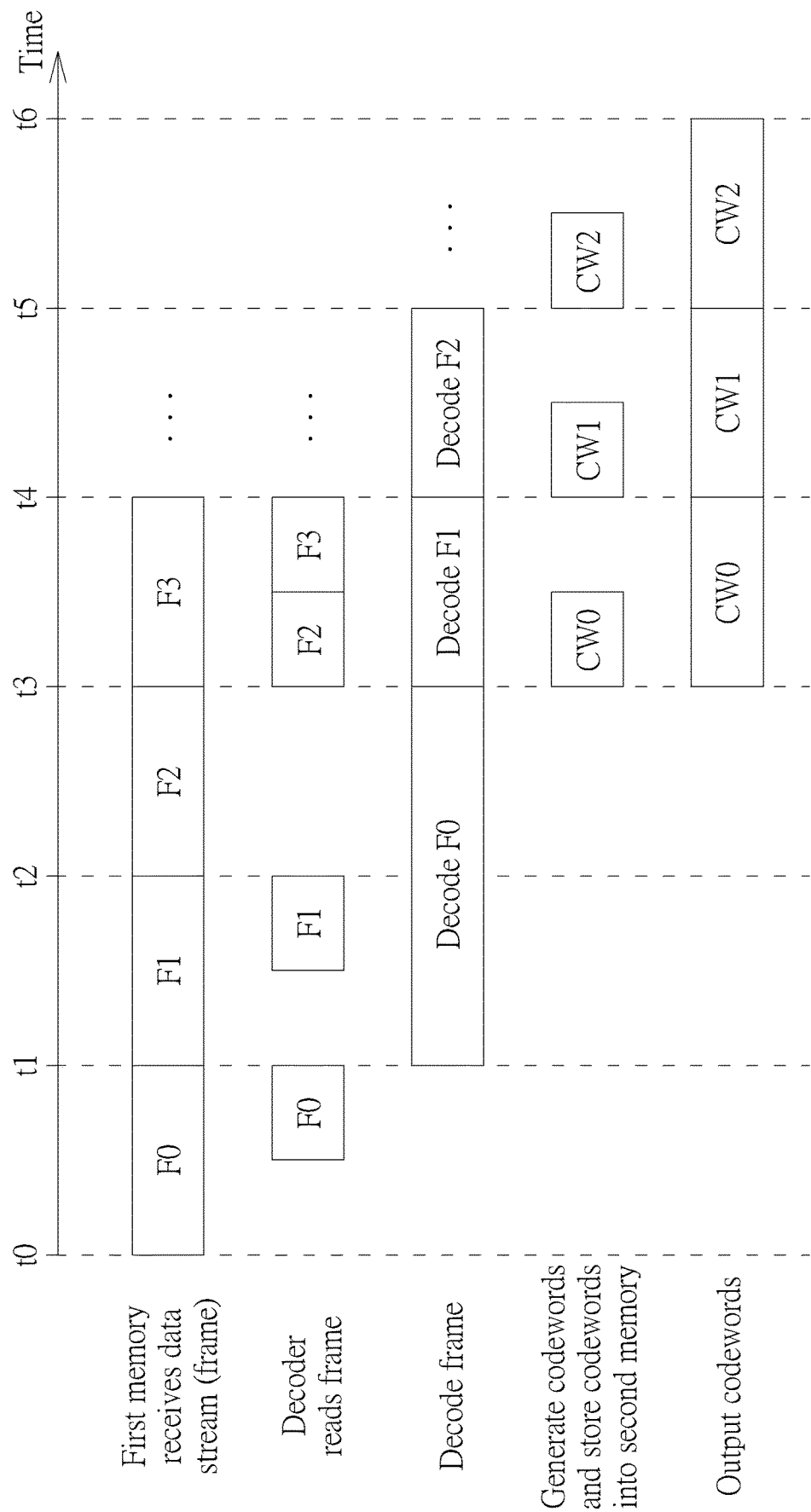
FIG. 4 is a timing diagram illustrating a circuit receiving and processing a plurality of frames of a data stream according to another embodiment of the present invention.

FIG. 4 is a timing diagram illustrating the circuit 100 receiving and processing the plurality of frames of the data stream Din according to another embodiment of the present invention, where this embodiment assumes that the first frame severely suffers from interference and is unable to successfully decode the first frame F0 within the time for the first memory 120 receiving one frame, and the allowed iteration count for decoding the first frame F0 is close to the time for the first memory receiving two frames, where this embodiment assumes that the time for the first memory 120 receiving each frame is substantially the same. As shown in FIG. 4, at the time point t0, the first memory receives the first frame F0 at the rate of fs, and the decoder 110 reads the first frame F0 from the first memory 120 at the rate of 2*fs when the data amount stored in the first memory 120 is greater than the threshold value. In this embodiment, the first memory 120 receives the whole first frame F0 at the time point t1, and the input buffer 112 within the decoder receives the whole first frame F0 after the time point t1. At the time point t1, the decoding circuit 114 then decodes the first frame F0 and generates corresponding codewords CW0, where since the first frame F0 severely suffers from interference and is successfully decoded until the time point t3, the decoder 110 writes the codewords CW0 into the second memory 130 at the rate of 2*fs at the time point t3. Concurrently, for a purpose of continuously transmitting codewords, at the time point t3, the second memory 130 transmits the codewords CW0 recently received from the decoder 110 to the backend circuit at the rate of fs.

Since the time for decoding the first frame F0 exceeds the time for the first memory 120 receiving one frame, i.e. the iteration count for decoding the first frame F0 is greater than the predetermined value, the control circuit 140 may control the decoding circuit 114 to make the allowed iteration count for decoding the second frame F1 be less than or equal to the predetermined value (in this embodiment, the predetermined value is the allowed count for the decoding circuit 114 executing iterative operations during the time for the first memory 120 receiving one frame).

Regarding the second frame F1, at the time point t1, the first memory receives the second frame F1 at the rate of fs, and the decoder 110 reads the second frame F1 from the first memory 120 at the rate of 2*fs when the data amount stored in the first memory 120 is greater than the threshold value. In this embodiment, the first memory 120 receives the whole second frame F1 at the time point t2, and the input buffer 112 within the decoder 110 receives the whole second frame F1 after the time point t2. Since the time for decoding the first frame is the period between the time points t1 and t3, the decoding circuit 114 may start to decode the second frame F1 and generate corresponding codewords CW1 at the time point t3, and writes the codewords CW1 into the second memory 130 at the rate of 2*fs at the time point t4. Concurrently, for a purpose of continuously transmitting codewords, at the time point t4, the second memory 130 transmits the codewords recently received from the decoder 110 to the backend circuit at the rate of fs.

It should be noted that since the allowed iteration count for decoding the second frame F1 is less than or equal to the predetermined value (i.e. exceeding the time for the first memory 120 receiving one frame is not allowed), the decoding circuit 114 has to transmit the codewords CW1 to the second memory 130 at the time point t4 even if the second frame F1 has not been successfully decoded.

In addition, since the time for decoding the first frame F0 is the period between the time points t1 and t3, during a period between the time points t2 and t3, in order to consider capacity problem of the input buffer 112, the decoder 110 may start to sequentially obtain the third frame F2 and the fourth frame F3 from the first memory 120 at the rate of 2*fs at the time point t3 even if the first memory 120 has received the whole third frame F2. The decoding circuit 114 starts to decode the third frame F2 and generate corresponding codewords CW2 at the time point t4, and writes the codewords CW2 into the second memory 130 at the rate of 2*fs at the time point t5. Concurrently, for a purpose of continuously transmitting codewords, at the time point t5, the second memory 130 transmit the codewords recently received from the decoder 110 to the backend circuit at the rate of fs.

It should be noted that, in the embodiment of FIG. 3, time points of transmitting the codewords CW0, CW1 and CW2 to the second memory 130 may be dynamically modified according to time points of successfully decoding the first frame F0, the second frame F1 and the third frame F2, respectively. More specifically, if the first frame F0 is successfully decoded before the time point t2, the decoder 110 may transmit the codewords CW0 to the second memory 130 before the time point t2.

As shown in FIG. 4, since the allowed maximum iteration count for decoding the first frame F0 is increased, probability of successfully decoding the first frame F0 is increased. In addition, the time points of outputting the codewords CW0, CW1 and CW2 in the embodiment of FIG. 4 is identical to the time points of outputting the codewords CW0, CW1 and CW2 in the embodiment of FIG. 3, which means implementation of dynamically modifying the iteration count shown in FIG. 4 will not affect output timing of the codewords.

It should be noted that, in the embodiment of FIG. 4, time points of transmitting the codewords CW0, CW1 and CW2 to the second memory 130 may be dynamically modified according to time points of successfully decoding the first frame F0, the second frame F1 and the third frame F2, respectively. More specifically, if the second frame F1 is successfully decoded before the time point t5, the decoder 110 may transmit the codewords CW1 to the second memory 130 before the time point t5.

Briefly summarized, the decoding method and associated circuit of the present invention modify an allowed maximum iteration count for a decoder decoding each frame according to decoding situations of previous frames, to increase the probability of successfully decoding frames severely suffering from interference in order to enhance decoding capability of the decoder.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit, comprising:
   a first memory, configured to receive a data stream;
   a decoder, coupled to the first memory, configured to receive the data stream to sequentially generate a plurality of frames, and sequentially decode the plurality of frames to respectively generate a plurality of codewords; and
   a control circuit, coupled to the decoder, configured to determine an allowed maximum iteration count for decoding a current frame according to an iteration count for successfully decoding at least one previous frame of the current frame;

wherein when the iteration count for successfully decoding said at least one previous frame is less than a threshold value, the control circuit increases the allowed maximum iteration count for decoding the current frame.

2. The circuit of claim 1, wherein when the iteration count for successfully decoding said at least one previous frame is less than the threshold value, the control circuit sets execution time of the allowed maximum iteration count for decoding the current frame to be greater than time for the first memory receiving one frame of the data stream.

3. The circuit of claim 1, wherein when the iteration count for successfully decoding said at least one previous frame is greater than the threshold value, the control circuit sets execution time of the allowed maximum iteration count for decoding the current frame to be equal to or less than time for the first memory receiving one frame of the data stream.

4. The circuit of claim 1, further comprising:
a second memory, coupled to the decoder, configured to receive the plurality of codewords corresponding to one frame from the decoder and transmit the plurality of codewords to a backend circuit;
wherein a rate of the decoder writing the plurality of codewords into the second memory is greater than a rate of the second memory transmitting the plurality of codewords to the backend circuit.

5. The circuit of claim 1, wherein the decoder is a low-density parity-check (LDPC) decoder.

6. A circuit, comprising:
a first memory, configured to receive a data stream;
a decoder, coupled to the first memory, configured to receive the data stream to sequentially generate a plurality of frames, and sequentially decode the plurality of frames to respectively generate a plurality of codewords; and
a control circuit, coupled to the decoder, configured to determine an allowed maximum iteration count for decoding a current frame according to an iteration count for successfully decoding at least one previous frame of the current frame;
wherein the first memory receives the data stream from outside of the circuit, and the decoder comprises an input buffer to receive the data stream from the first memory; wherein a rate of the input buffer receiving the data stream from the first memory is greater than a rate of the first memory receiving the data stream from outside of the circuit.

7. A decoding method, comprising:
utilizing a first memory of a circuit to receive a data stream;
utilizing a decoder of the circuit to receive the data stream from the first memory to sequentially generate a plurality of frames, and sequentially decoding the plurality of frames to respectively generate a plurality of codewords; and
determining an allowed maximum iteration count for decoding a current frame according to an iteration count for successfully decoding at least one previous frame of the current frame;
wherein the step of determining the allowed maximum iteration count for decoding the current frame comprises:
when the iteration count for successfully decoding said at least one previous frame is less than a threshold value, increasing the allowed maximum iteration count for decoding the current frame.

8. The decoding method of claim 7, wherein the step of determining the allowed maximum iteration count for decoding the current frame comprises:
when the iteration count for successfully decoding said at least one previous frame is less than a threshold value, setting execution time of the allowed maximum iteration count for decoding the current frame to be greater than time for the first memory receiving one frame of the data stream.

9. The decoding method of claim 7, wherein the step of determining the allowed maximum iteration count for decoding the current frame comprises:
when the iteration count for successfully decoding said at least one previous frame is greater than a threshold value, setting execution time of the allowed maximum iteration count for decoding the current frame to be equal to or less than time for the first memory receiving one frame of the data stream.

10. The decoding method of claim 7, wherein the first memory receives the data stream from outside of the circuit, and the decoder comprises an input buffer to receive the data stream from the first memory; wherein a rate of the input buffer receiving the data stream from the first memory is greater than a rate of the first memory receiving the data stream from outside of the circuit.

11. The decoding method of claim 7, further comprising:
utilizing a second memory to receive the plurality of codewords corresponding to one frame from the decoder and transmit the plurality of codewords to a backend circuit;
wherein a rate of the decoder writing the plurality of codewords into the second memory is greater than a rate of the second memory transmitting the plurality of codewords to the backend circuit.

12. The decoding method of claim 7, wherein the decoder is a low-density parity-check (LDPC) decoder.

* * * * *